United States Patent
Seitz et al.

(10) Patent No.: US 6,404,891 B1
(45) Date of Patent: Jun. 11, 2002

(54) VOLUME ADJUSTMENT AS A FUNCTION OF TRANSMISSION QUALITY

(75) Inventors: Forrest Seitz, Beaverton; Stan Sasaki, Lake Oswego, both of OR (US)

(73) Assignee: Cardio Theater, Hillsboro, OR (US)

(*) Notice: Subject to any disclaimer, the term of this patent is extended or adjusted under 35 U.S.C. 154(b) by 0 days.

(21) Appl. No.: 08/956,376

(22) Filed: Oct. 23, 1997

(51) Int. Cl.⁷ .............................. H03G 3/00; H04B 1/10
(52) U.S. Cl. .................. 381/107; 381/107; 381/77; 381/2; 455/222
(58) Field of Search ............................... 381/104, 107, 381/106, 2, 77; 455/200.1, 222, 219, 226.1, 226.2; 375/316, 345, 346, 350

(56) References Cited

U.S. PATENT DOCUMENTS 5,483,690 A * 1/1996 Schroder ................. 455/226.1
5,615,412 A * 3/1997 Doran ....................... 455/222
5,726,991 A * 3/1998 Chen et al. ................. 371/5.1

OTHER PUBLICATIONS

"Instruction Manual for Amplifier Models 800 and 1600," Cardio Theater, pp. 1–14 (date prior to Oct. 23, 1997).

* cited by examiner

Primary Examiner—Forester W. Isen
Assistant Examiner—Brian T. Pendleton
(74) Attorney, Agent, or Firm—Klarquist Sparkman, LLP

(57) ABSTRACT

A receiver in an audio distribution system provides graceful degradation of audio quality as transmission quality decreases by dynamically adjusting the volume of audio output as a function of transmission quality. The receiver estimates the rate of transmission errors in a transmission link on which the audio signal is distributed by detecting errors in known information embedded in the audio signal. As the rate of transmission errors increases, the receiver increasingly attenuates the volume of the audio output. The receiver dynamically adjusts the volume relative to the rate of transmission errors applying a smoothing function to avoid disruptive rapid fluctuations in audio output volume.

12 Claims, 3 Drawing Sheets

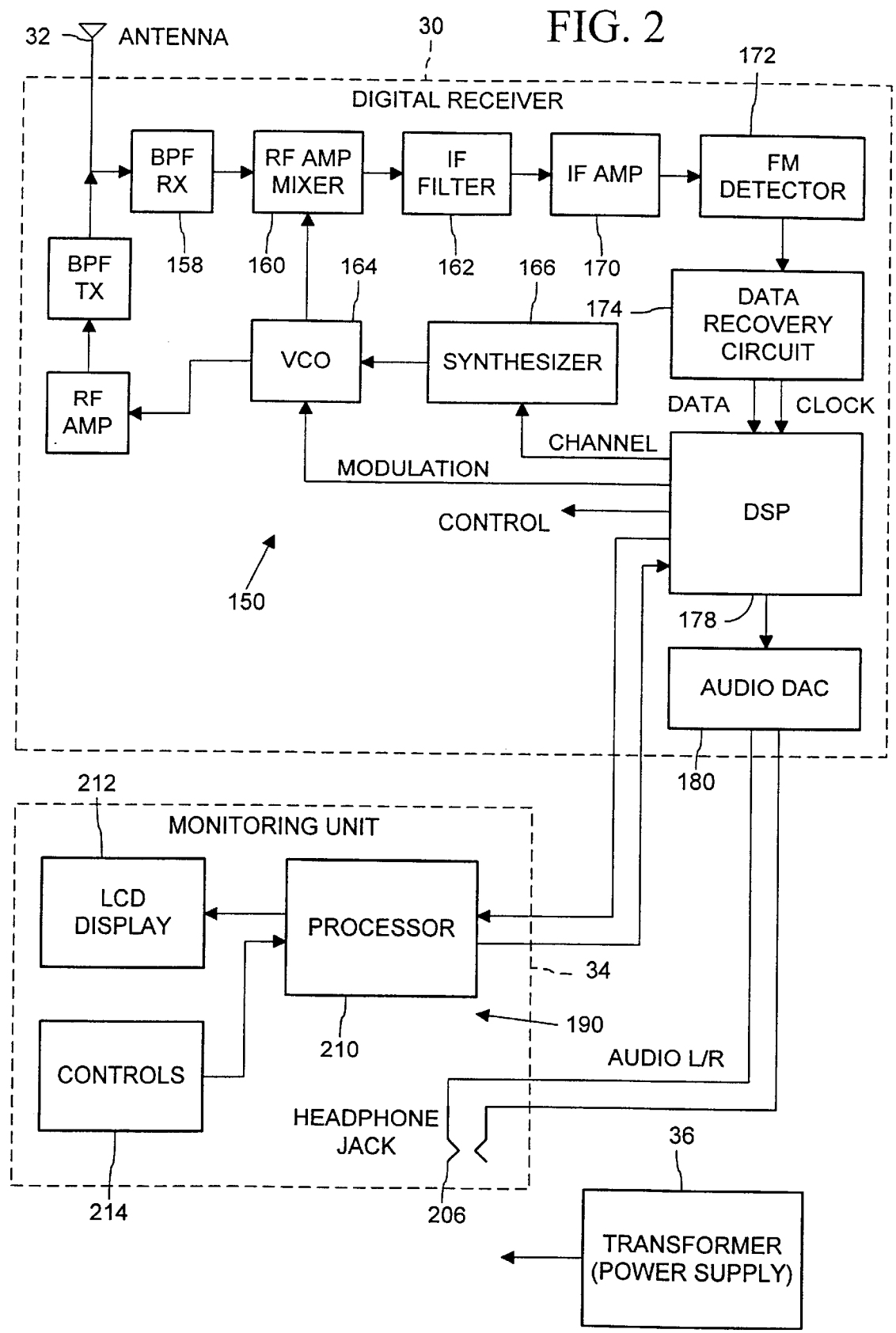

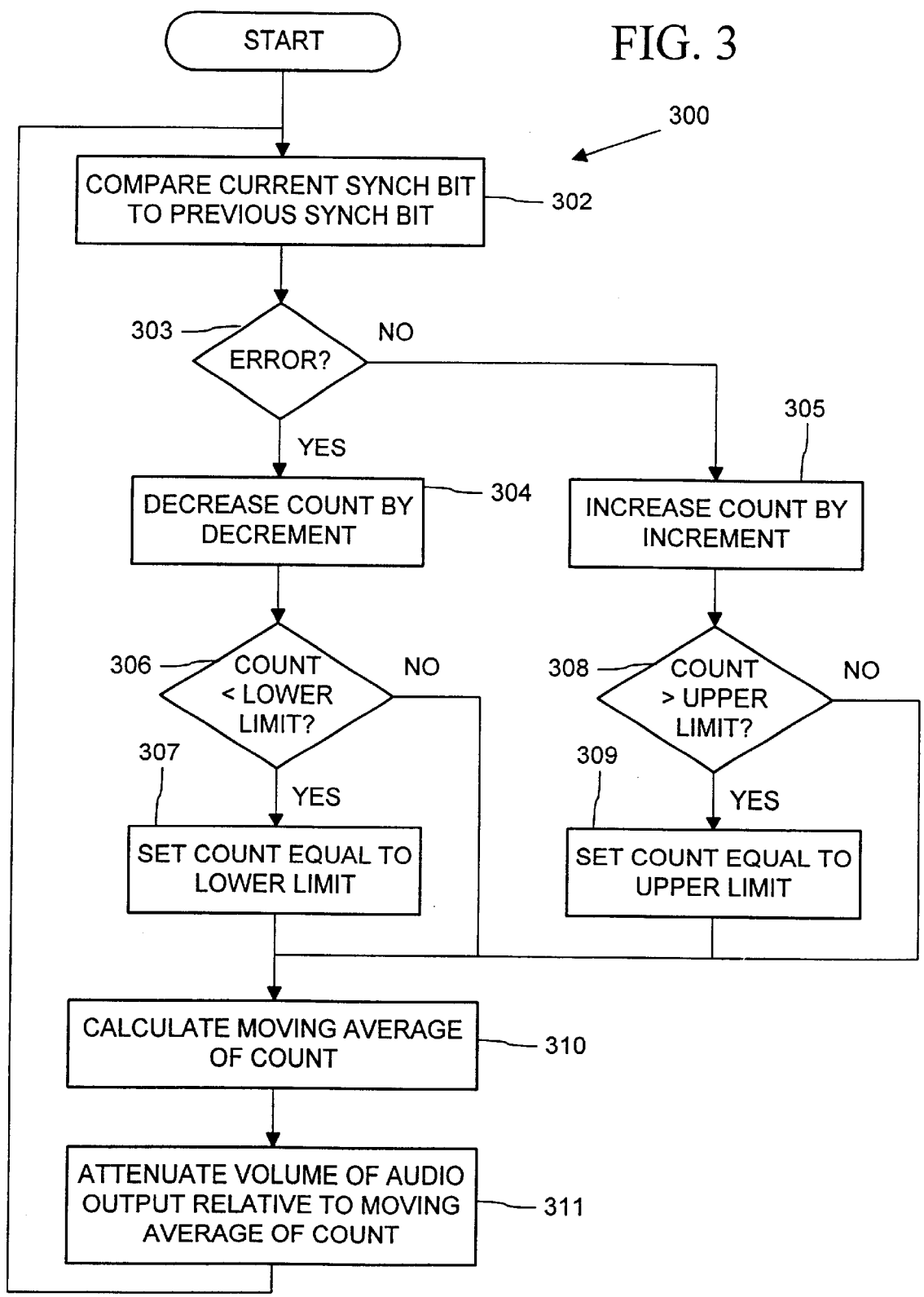

VOLUME ADJUSTMENT AS A FUNCTION OF TRANSMISSION QUALITY

FIELD OF THE INVENTION

The invention relates generally to audio signal distribution systems, and more particularly relates to maintaining quality of audio reproduction in conditions of poor transmission quality.

BACKGROUND AND SUMMARY OF THE INVENTION

In audio distribution systems where audio signals are transmitted digitally, the audio signal decoded from the transmission can quickly become unintelligible when poor transmission quality results in a large number of bit errors. However, there is a region between perfect reception without transmission errors and unintelligibility where the decoded audio signal represents a degraded level of audio quality. Nonetheless, when the decoded audio signal is output directly, the transmission errors are disruptive and can have a jarring effect on the listener.

In accordance with the present invention, the quality of a received audio signal is allowed to degrade gracefully with decreasing transmission quality by controlling the volume at which the received audio signal is output. Disruptive noise in the audio output caused by the transmission errors are thus made less perceptible. Preferably, the audio signal is increasingly attenuated in relation to the rate of transmission errors. As compared to muting the audio output at a subjectively determined bit error rate, this dynamic volume adjustment eliminates rapid fluctuations between full and muted volumes which also is disruptive and subjectively undesirable to listeners.

In one aspect of the invention, the transmission quality is assessed by detecting errors occurring in known bit patterns embedded in the audio signal. Since the state of the audio signal per se is not known a priori at the receiver, errors in the known bit patterns embedded with the audio signal are indicative of the transmission quality. In an embodiment of the invention illustrated herein for example, the known bit pattern is a synch bit embedded one synch bit per 16-bit word of an audio signal transmitted on a digital serial transmission link. The rate of errors is tracked by maintaining a count which is modified between upper and lower limits according to whether each occurrence of the known bit pattern is received with or without error, such as by incrementing for each occurrence without error and decrementing for each occurrence with error. The increment value, decrement value, upper limit and lower limit are parameters that can be selected subjectively for a particular application.

In another aspect of the invention, the count representing the rate of transmission errors is smoothed, such as by use of a filter or calculating a moving average of the count. The volume of the audio output is then varied according to the smoothed count value. This avoids varying the audio output volume at rates faster than the listener's ability to perceive volume change.

Additional features and advantages of the invention will be made apparent from the following detailed description of a preferred embodiment which proceeds with reference to the accompanying drawings.

BRIEF DESCRIPTION OF THE DRAWINGS

FIG. 2 is a block diagram of circuitry in a receiver and monitoring unit at a listening station of the system shown in FIG. 1, which provides dynamic volume adjustment as a function of transmission quality according to the invention.

FIG. 3 is a flow chart showing the dynamic volume adjustment operation of the receiver and monitoring unit circuitry of FIG. 2.

DETAILED DESCRIPTION OF THE ILLUSTRATED EMBODIMENTS

Figure 1:
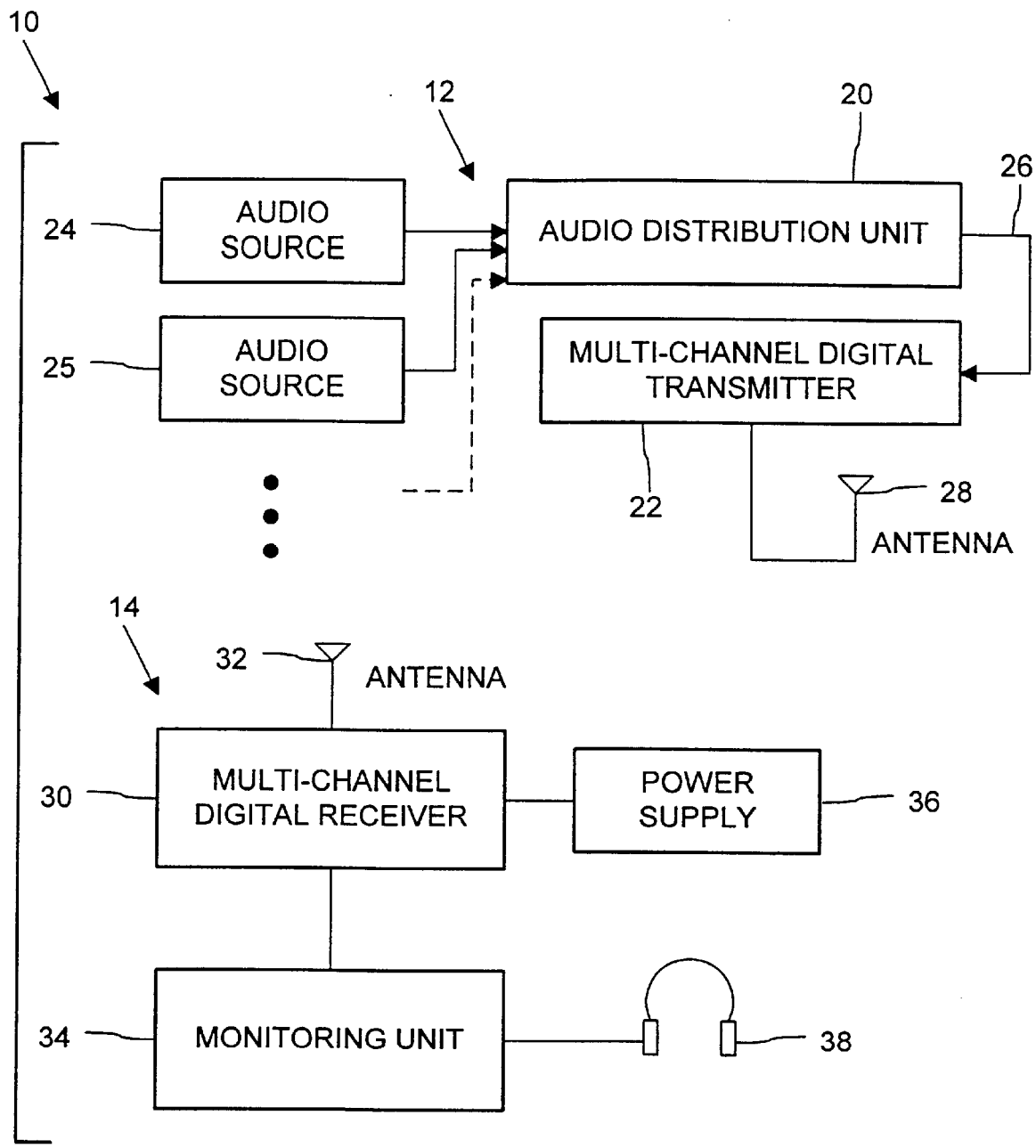
FIG. 1 is a block diagram illustrating an audio distribution system according to the illustrated embodiment of the invention that utilizes a wireless, digital serial transmission link to distribute audio signals from a central station to receivers at multiple listening stations.

With reference to FIG. 1, an illustrated embodiment of the invention is implemented in an audio distribution system 10 described in a co-pending U.S. patent application entitled, "Wireless Multi-channel Digital Audio Distribution System With Adjustable Transmission Frequencies," filed concurrently herewith and incorporated herein by reference (a copy of which is attached). The audio distribution system 10 includes a central station 12 and one or more listening stations 14, and distributes audio programming from multiple audio programming sources at the central station to each of the listening stations 14. The audio distribution system 10 is useful in a health club and other like settings (e.g., in a waiting area of an airport or bus station, a dentist's office, or beauty salon, among others) to make a variety of audio programming available for individual listening at various locations (i.e., the listening stations 14) distributed about the setting, such as at various exercise equipment (e.g., stair machines, rowing machines, stationary bicycles, treadmills, etc.) within a cardiovascular fitness or conditioning room of a health club.

The illustrated audio distribution system 10 provides equipment at the central station 12 including an audio distribution unit 20 and a multi-channel digital transmitter 22 for distributing audio programming from plural audio sources 24-25 to the listening stations 14. The audio distribution unit 20 in the illustrated system is the Cardio Theatre Amplifier Models 800 or 1600 available from Cardio Theatre, Inc. These amplifiers have audio signal inputs for connecting to the audio sources 24-25 so as to receive a mono or stereo analog audio signals from the audio sources 24-25. The Cardio Theatre Amplifier Model 800 has inputs for receiving up to 8 audio signals, while the Amplifier Model 1600 has inputs for connecting to up to 16 audio signal sources.

The audio distribution unit 20 digitizes the audio signals that are input from the audio sources 24-25, encodes the audio signals as a digital bit stream, and outputs the digital bit stream on a coaxial cable 26. Data in the digital bit stream is transmitted at a rate of 10 Megabit/second from the audio distribution unit 20, and consists of frames having 512 bits of data each. Each frame contains two 16 bit audio samples (left and right stereo samples) for each of 16 channels. In the illustrated audio distribution system 10, this digital bit stream output is connected via the coaxial cable to an input of the multi-channel digital transmitter 22.

The multi-channel digital transmitter 22, in turn, separates the audio signals from the digital bit stream, and broadcasts each audio signal in a separate channel from an antenna 28. In the illustrated audio distribution system, the multi-channel digital transmitter 22 transmits the audio signals on 16 separate channels. The transmitter first compresses the audio samples in the channel using conventional digital audio compression techniques (the well-known G722 audio compression technique in the illustrated circuitry 60), then modulates the compressed audio data onto a radio frequency carrier of the particular channel using conventional modulation techniques, such as frequency shift key ("FSK") modulation.

In the illustrated transmitter 22, the signal transmitted in each channel is a digitally modulated radio frequency signal with a bit rate of 156,256 bits per second. This data is organized as 16-bit data words. In each 16-bit word, one bit is used as a synch bit which toggles between 1 and 0 on each successive word, and serves to indicate word boundaries. An additional bit of each word encodes a table of frequencies at which the channels are transmitted as described in the attached co-pending patent application. The remaining fourteen bits represent the compressed, digital stereo audio signal.

At each of the listening stations 14, the illustrated audio distribution system 10 provides a multi-channel digital receiver 30, an antenna 32, a monitoring unit 34, and a power supply 36. The monitoring unit 34 has a keypad and channel display which operate as a control panel for the multi-channel digital receiver 30 at which a person (herein called the "user") can select a channel for listening, such as by entering a channel selection using the keypad. The monitoring unit 34 also provides a headphone jack for the user to listen to the audio programming on the selected channel with a pair of headphones 38. The monitoring unit 34 preferably is mounted in a location at the listening station 14 that is easily accessible by the user. For example, the monitoring unit 34 may be mounted on a hand rail or other part of a piece of exercise equipment that is within reach of the user during exercising. Alternatively, the circuitry of the monitoring unit can be integrated with or built into a control panel of the exercise equipment, rather than mounted to the exercise equipment as an accessory.

The multi-channel digital receiver 30 at the listener station 14 operates under control of the monitoring unit 34 to receive the audio signal on the channel selected by the user for listening. The multi-channel digital receiver 30 tunes the transmission frequency of the selected channel to receive the digital audio signal on the selected channel. The multi-channel digital receiver 30 also converts the digital audio signal to analog and outputs the audio signal to the monitoring unit 34 for driving the headphones 38.

With reference to FIG. 2, the multi-channel digital receiver 30 (FIG. 1) contains circuitry 150 (FIG. 5) to receive an audio signal on a channel selected by the user on the monitoring unit 34, and also circuitry to transmit data to the central data collection station 40. The circuitry 150 of the multi-channel digital receiver 30 is mounted in a box-like enclosure which has the antenna 34 attached at one end and connectors for connecting to the monitoring unit 34 and power supply 36 (an AC/DC transformer).

At an individual listening station 14 (FIG. 1), the signals transmitted from the multi-channel digital transmitter 22 at multiple radio frequencies are picked up at the antenna 32. In the circuitry 150 of the multi-channel digital receiver 30, the antenna 32 connects to a receiving band pass filter ("BPF RX") 158, which passes the signal along to a radio frequency amplifier/mixer 160 and an intermediate frequency filter 162. The illustrated band pass filter is implemented as a saw band pass filter that passes the received signals in a pass band of approximately 900–930 MHz. The radio frequency amplifier/mixer 160 mixes the received signals with a locally generated signal so as to heterodyne the received signal at the radio frequency of a user-selected channel (selected with the monitoring unit as described below) to an intermediate frequency of 70.7 MHz, which is then filtered in the intermediate frequency filter 162 with a pass band of 70.7 MHz. The locally generated signal is produced by a voltage controlled oscillator ("VCO") 164 and synthesizer 166. The intermediate frequency filter 162 thus passes only the signal that was transmitted from the multi-channel digital transmitter 22 at the frequency of the user selected channel.

After heterodyning to the intermediate frequency, the signal in the user-selected channel is passed to an intermediate frequency amplifier 170, frequency modulation detector 172 and a data recovery circuit 174 in the circuitry 150. In the intermediate frequency amplifier 170, the signal is again mixed, this time to a 10 MHz frequency. The frequency modulation detector 172 detects the frequency modulation on the signal and demodulates the signal. The data recovery circuit then reproduces the data stream and clock signal of the single user-selected channel.

Next, the data recovery circuit outputs the data stream and clock to a digital signal processor ("DSP") 178. Initially, the DSP 178 synchronizes with the data stream using the synch bits. The DSP 178 thereafter processes the data stream to decompress the audio signal data and separate out the left and right digital audio samples, which the DSP outputs to an audio digital-to-analog converter ("DAC") 180. The audio DAC 180 converts the digital audio samples to an analog audio signal, and outputs the analog audio signal to drive headphones attached at the monitoring unit 34. Additionally, the DSP 178 provides dynamic volume adjustment as a function of transmission quality as described more fully below with reference to FIG. 3. The DSP 178 in the illustrated circuitry 150 is a model ADSP2105 available from Analog Devices.

With reference still to FIG. 2, the monitoring unit 34 includes circuitry 190 for channel selection and volume control by the user. The circuitry 190 is housed in a box having an LCD display, channel selection keys, and volume control keys. Alternatively, the monitoring unit 34 can be integrated into a control panel of exercise equipment in the health club setting or like equipment in other settings at the listening station 14 (FIG. 1), in which case the equipment provides power to the digital receiver 30 rather than use a separate transformer power supply 36. The LCD display displays a currently selected channel number between 1 and 16 (inclusive). The user at the listening station selects a channel by pressing channel up key and channel down key to respectively increment and decrement the displayed channel number. The volume control keys can be pressed to increase, decrease or mute the audio signal. A headphone jack 206 is provided on a side of the box.

The circuitry 190 (FIG. 5) of the monitoring unit 34 includes a microprocessor 210, an LCD display driver 212, and control circuitry 214. The control circuitry 214 produces electrical signals for input to the microprocessor responsive to the user's pressing channel selection and volume control keys. The microprocessor 210 is programmed to cause display of the currently selected channel number on the LCD display by the LCD display driver 212. The microprocessor 210 further communicates the user's channel selection and volume control inputs to the DSP 178 in the multi-channel digital receiver 30. In response to the user's channel selection, the DSP 178 controls the VCO 164 and synthesizer 166 to produce the appropriate locally generated signal to heterodyne the frequency of the user-selected channel to the intermediate frequency (70.7 MHz). The DSP 178 also responds to the volume control inputs to adjust the amplitude of the analog signal produced with the audio DAC 180.

With reference now to FIG. 3, the multi-channel digital receiver 30 performs a process 300 according to the invention for dynamic volume adjustment as a function of transmission quality. More specifically, the receiver 30 increasingly attenuates the audio output to the monitoring unit as the transmission quality decreases, so as to make disruptions caused by poor transmission quality less perceptible in the audio output. Further, the process 300 more gradually adjusts audio output volume to avoid abrupt or rapid volume fluctuations.

In the illustrated audio distribution system 10, the receiver 30 assesses the quality of transmission on the user selected channel using the synch bit. As described above, each channel in the audio distribution system 10 is a digital serial transmission link operating at 156,256 bits per second, and transmits compressed audio data organized as 16-bit words. Each word contains a synch bit that alternates between the bit values 1 and 0 on successive words, and is used at the receiver 30 to align or synchronize the bit positions in the word. However, there is no a priori knowledge at the receiver 30 of the state of the remaining 15 bits of each word (in which the compressed audio data is encoded). Since the state of the synch bit is known, the receiver 30 uses errors in the synch bit as an estimate or indication of the bit error rate performance of the digital serial transmission link from the transmitter 22 (FIG. 1) to receiver 30. In alternative embodiments of the invention, other information embedded in a transmitted audio signal that is known at the receiver can be used to estimate the bit error rate of the transmission link, such as a start or stop bit, word or frame header bits, parity bit, check sum or the like.

In the illustrated multi-channel digital receiver 30, the dynamic volume adjustment process 300 is implemented in the signal processing instruction code executed on the DSP 178. The DSP 178 performs an iteration of the process 300 for each synch bit received, i.e., at the synch bit frequency of 9766 Hz. At a first step 302 of each iteration, the DSP 178 compares the newly received synch bit (hereafter the "current synch bit") to the synch bit in the immediately preceding word. Since the synch bits of successive words alternates in value, the DSP 178 considers a failure of the synch bit to change in value from the preceding word to be a transmission error. Thus, if the current synch bit and previous synch bit differ in value, the DSP 178 determines that there is no error. Otherwise, if the current synch bit and previous synch bit are identical in value (i.e., both 1s or 0s), then the DSP 178 determines that a transmission error has occurred.

The DSP 178 estimates the rate of bit errors on the transmission link by maintaining a count value (herein called the "count") which the DSP 178 increments by a set amount (herein called the "increment") each time there is no error in the synch bit, and decrements by a set amount (herein called the "decrement") for each error detected in the synch bit as indicated in steps 303–305. Additionally, the DSP 178 limits the count to values between two thresholds (herein called the "upper limit" and "lower limit"), as indicated at steps 306–309. The increment, decrement, upper limit, and lower limit are parameters that can be varied as desired to suit the application, such as for transmission links which use other digital audio encoding formats, etc. In the illustrated receiver 30, the increment, 30 decrement, upper limit and lower limit are +1, −5, 10, and 0, respectively. Thus, the illustrated DSP 178 increments the count by 1 at step 305 for each word of the transmitted signal where the synch bit is not detected as having an error, and decrements the count by 5 at step 304 for each word detected as having a synch bit error. The illustrated DSP 178 then limits the count at steps 306–309 to values between 0 and 10, inclusive.

Next, the count which is used to estimate the bit error rate preferably is smoothed. This is because the count is evaluated at the synch bit rate of 9766 Hz, which is faster than a human listener's ability to perceive changes in audio volume. Smoothing the count thus avoids rapid fluctuations in volume which can cause disruptive audio artifacts. In the illustrated process 300, the DSP 178 smoothes the count by calculating a moving average of the count at step 310 of each iteration of the process (i.e., averaging the value of the count in a current iteration with those in a number of previous iterations). In alternative embodiments, the count can be smoothed using other digital or analog filters or like averaging techniques. For example, a single-pole low-pass filter with a bandwidth of 6 Hz can be used.

Then, at a step 311, the DSP 178 adjusts the volume of the audio output according to the smoothed value (moving average) of the count. In the illustrated receiver, when the smoothed count has a value equal to the upper limit (e.g., 10) representing an absence of transmission errors, the DSP 178 causes the audio to be output at full or unattenuated volume (subject to the user's volume setting). As the smoothed count decreases below the upper limit (indicating a corresponding increase in the rate of transmission errors), the DSP 178 causes increasing attenuation of the audio output. In the illustrated receiver 30, the DSP 178 attenuates the volume in logarithmic steps of 2 dB per decrease of 1 in the smoothed count, yielding a maximum attenuation of 20 dB at the lower limit (0). The attenuation can be accomplished by digitally processing in the DSP 178, or after conversion to analog in the audio DAC 180.

Having described and illustrated the principles of our invention with reference to a preferred embodiment, it will be recognized that the preferred embodiment can be modified in arrangement and detail without departing from such principles. In view of the many possible embodiments to which the principles of our invention may be applied, it should be recognized that the detailed embodiments are illustrative only and should not be taken as limiting the scope of our invention. Rather, we claim as our invention all such embodiments as may come within the scope and spirit of the following claims and equivalents thereto.

We claim:

1. An audio distribution system, comprising:
   a central transmission station for transmitting an audio signal in a digital serial transmission link;
   a reception station comprising:
      a receiver for receiving the audio signal on the digital serial transmission link;
      an error detector for detecting errors in transmission of the audio signal on the digital serial transmission link, the error detector comprising:
         a counter for maintaining a count representative of the rate of the detected transmission errors, and to modify the count in a first direction responsive to a transmission error detected by the error detector and in a second direction responsive to an absence of a transmission error detected by the error detector; and
         a count smoothing means for producing a smoothed value related to a moving average of the count; and
      a volume controller for dynamically adjusting volume of the audio signal as a function of the rate of the detected transmission errors, the volume controller operating to dynamically adjust the volume of the audio signal based on the smoothed value whereby rapid volume fluctuation is avoided.

2. The audio distribution system of claim 1 wherein the central transmission station comprises an encoder for encoding the audio signal with a known bit pattern embedded therein for transmission on the digital serial transmission link, and wherein the error detector identifies the transmission errors based on deviations from the known bit pattern.

3. A digital audio receiver in a digital audio distribution system in which a digital audio signal is transmitted having a recurring bit pattern embedded therein, the digital audio receiver comprising:

a decoder for decoding the recurring bit pattern in the digital audio signal;

an error detector for detecting whether successive instances of the recurring bit pattern contain an error;

a counter for maintaining a count within predetermined maximum and minimum limits, and for modifying the count by a predetermined non-zero first value if the error detector detects an instance containing an error and by a predetermined non-zero second value if the error detector detects an instance not containing an error; and a volume adjuster for adjusting the volume of the audio signal according to the count.

4. The digital audio receiver of claim 3 comprising:

an averaging filter for calculating a moving average of the count; and the volume adjuster adjusting the volume of the audio signal relative to the moving average of the count.

5. A method of dynamically adjusting the output volume of a received digital audio signal relative to transmission quality, comprising:

decoding the digital audio signal;

detecting errors in transmission of the digital audio signal;

modifying a count by a predetermined non-zero first value per unit of the digital audio signal detected with a transmission error;

modifying the count by a predetermined non-zero second value per unit of the digital audio signal detected to be absent transmission errors;

limiting the count to within predetermined maximum and minimum limits;

generating an audio output signal corresponding to the digital audio signal; and adjusting the volume of the audio output signal according to the count.

6. The method of claim 5 further comprising:

calculating a moving average of the count; and adjusting the volume of the audio output signal relative to the moving average of the count.

7. The method of claim 5 wherein the digital audio signal has a known bit pattern embedded therein comprising a single bit embedded in the digital audio signal at predetermined increments, and said detecting errors in transmission of the digital audio signal comprises detecting errors in transmission of the known bit pattern embedded in the digital audio signal.

8. The method of claim 7 wherein the single bit is a synchronization bit that alternates in value between zero and one; and detecting errors in transmission of the known bit pattern comprises detecting a transmission error when two successive synchronization bits do not differ in value.

9. The method of claim 3 wherein the recurring bit pattern is a synchronization bit that alternates in value between zero and one.

10. A digital audio receiver in a digital audio distribution system in which a digital audio signal is transmitted having a synchronization bit pattern superimposed onto audio data of the digital audio signal, the digital audio receiver comprising:

a decoder for decoding the synchronization bit pattern in the digital audio signal;

an error detector for detecting a rate of errors in transmission of the synchronization bit pattern; and a volume adjuster for adjusting an output audio volume produced from the digital audio signal according to the detected rate of errors.

11. The digital audio receiver of claim 10 wherein the synchronization bit pattern is superimposed on a least significant bit of the audio data at regular intervals.

12. The digital audio receiver of claim 11 wherein the synchronization bit pattern alternates in value between zero and one; and detecting errors in transmission of the known bit pattern comprises detecting a transmission error when two successive synchronization bits do not differ in value.

* * * * *